United States Patent
Kataoka

(10) Patent No.: US 11,444,074 B2
(45) Date of Patent: Sep. 13, 2022

(54) SEMICONDUCTOR DEVICE AND METHOD FOR MANUFACTURING SAME

(71) Applicant: KABUSHIKI KAISHA TOKAI-RIKA-DENKI-SEISAKUSHO, Niwa-gun (JP)

(72) Inventor: Yoshikazu Kataoka, Niwa-gun (JP)

(73) Assignee: KABUSHIKI KAISHA TOKAI-RIKA-DENKI-SEISAKUSHO, Aichi-ken (JP)

( * ) Notice: Subject to any disclaimer, the term of this patent is extended or adjusted under 35 U.S.C. 154(b) by 0 days.

(21) Appl. No.: 17/260,514

(22) PCT Filed: Jul. 8, 2019

(86) PCT No.: PCT/JP2019/027017
§ 371 (c)(1),
(2) Date: Jan. 14, 2021

(87) PCT Pub. No.: WO2020/017385
PCT Pub. Date: Jan. 23, 2020

(65) Prior Publication Data
US 2021/0305234 A1  Sep. 30, 2021

(30) Foreign Application Priority Data

Jul. 18, 2018  (JP) .............................. JP2018-135264

(51) Int. Cl.
*H01L 27/02* (2006.01)
*H01L 21/762* (2006.01)
(Continued)

(52) U.S. Cl.
CPC .... *H01L 27/0255* (2013.01); *H01L 21/76224* (2013.01); *H01L 29/0619* (2013.01);
(Continued)

(58) Field of Classification Search
CPC ........... H01L 27/0255; H01L 29/66136; H01L 29/8611; H01L 29/0615; H01L 29/0619; H01L 21/76286; H01L 27/0629
See application file for complete search history.

(56) References Cited

U.S. PATENT DOCUMENTS

| | | |
|---|---|---|
| 2004/0033645 A1 | 2/2004 | Yu |
| 2009/0050967 A1* | 2/2009 | Takasu .................... H01L 29/78 257/355 |

(Continued)

FOREIGN PATENT DOCUMENTS

| | | |
|---|---|---|
| JP | 4-239154 | 8/1992 |
| JP | 4-245469 | 9/1992 |

(Continued)

OTHER PUBLICATIONS

International Search Report for PCT/JP2019/027017 dated Sep. 17, 2019, 4 pages.

*Primary Examiner* — Joseph C. Nicely
(74) *Attorney, Agent, or Firm* — Dority & Manning, P.A.

(57) ABSTRACT

A semiconductor device including a protected element, an element isolation region, a contact region, and a shield region. The protected element is configured including a p-n junction diode between an anode region and a cathode region, and is arranged in an active layer of a substrate. A periphery of the diode is surrounded by the element isolation region. The contact region is arranged at a portion on a main face of the anode region, is set with a same conductivity type as the anode region, and is set with a higher impurity concentration than the anode region. The shield region is arranged between the cathode region and the contact region so as to extend from the main face of the anode region as far as a region deeper than a depth of the contact region and shallower than the anode region. The shield region is con- (Continued)

figured including a semiconductor region with an opposite conductivity type to the anode region.

2 Claims, 5 Drawing Sheets

(51) Int. Cl.
    *H01L 29/40*     (2006.01)
    *H01L 29/66*     (2006.01)
    *H01L 29/06*     (2006.01)

(52) U.S. Cl.
    CPC .......... *H01L 29/401* (2013.01); *H01L 29/407* (2013.01); *H01L 29/66136* (2013.01)

(56) References Cited

U.S. PATENT DOCUMENTS

| | | | |
|---|---|---|---|
| 2021/0273118 A1* | 9/2021 | Kataoka | H01L 27/06 |
| 2021/0280573 A1* | 9/2021 | Kataoka | H01L 29/87 |
| 2021/0296161 A1* | 9/2021 | Kataoka | H01L 27/0727 |

FOREIGN PATENT DOCUMENTS

| | | |
|---|---|---|
| JP | 2006-041476 | 2/2006 |
| JP | 2008-153403 | 7/2008 |
| JP | 2008153403 A * | 7/2008 |
| JP | 2009-049296 | 3/2009 |
| JP | 4-354876 | 10/2009 |

* cited by examiner

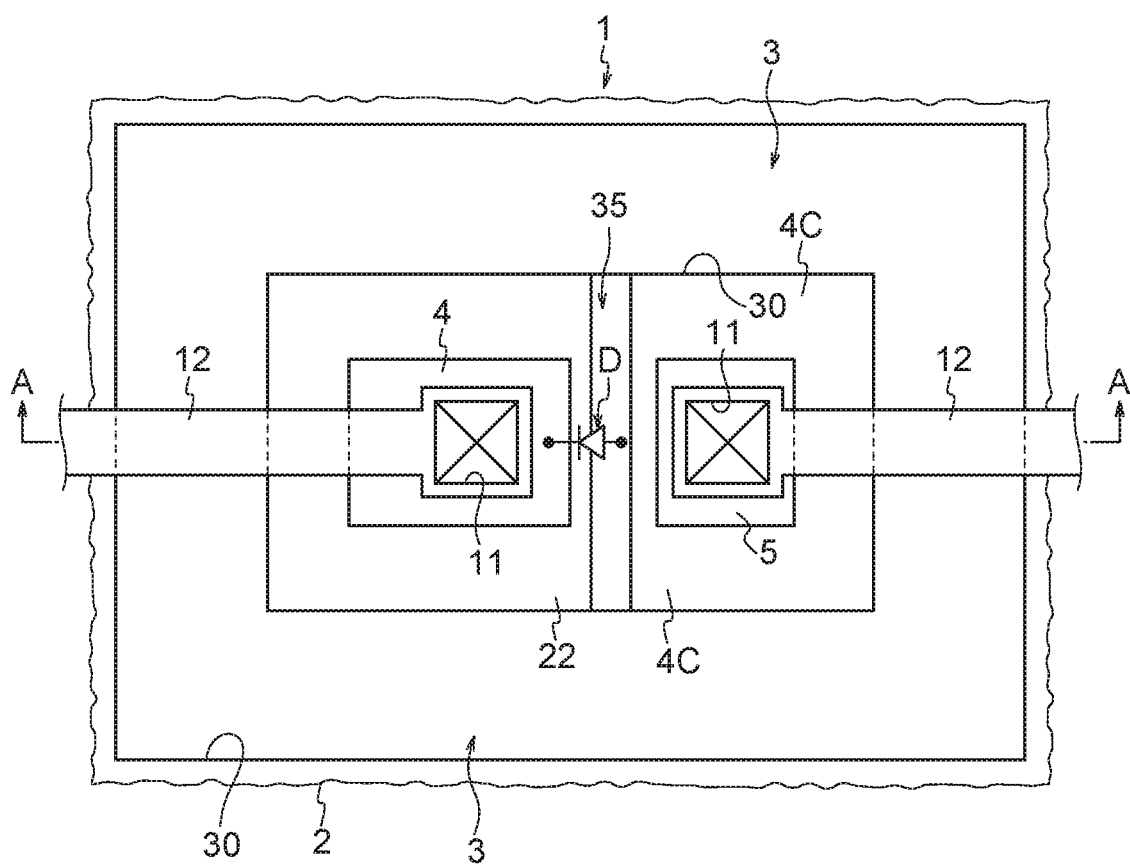

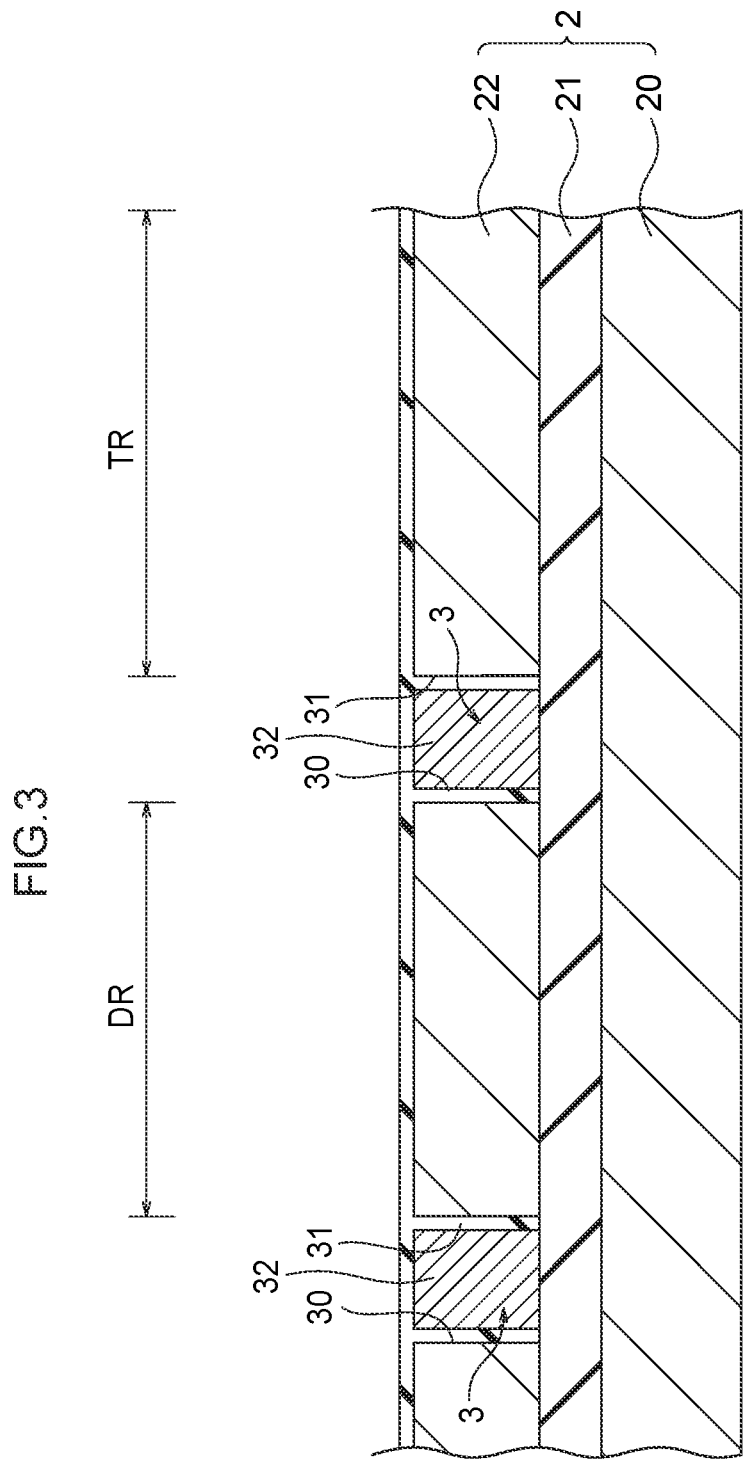

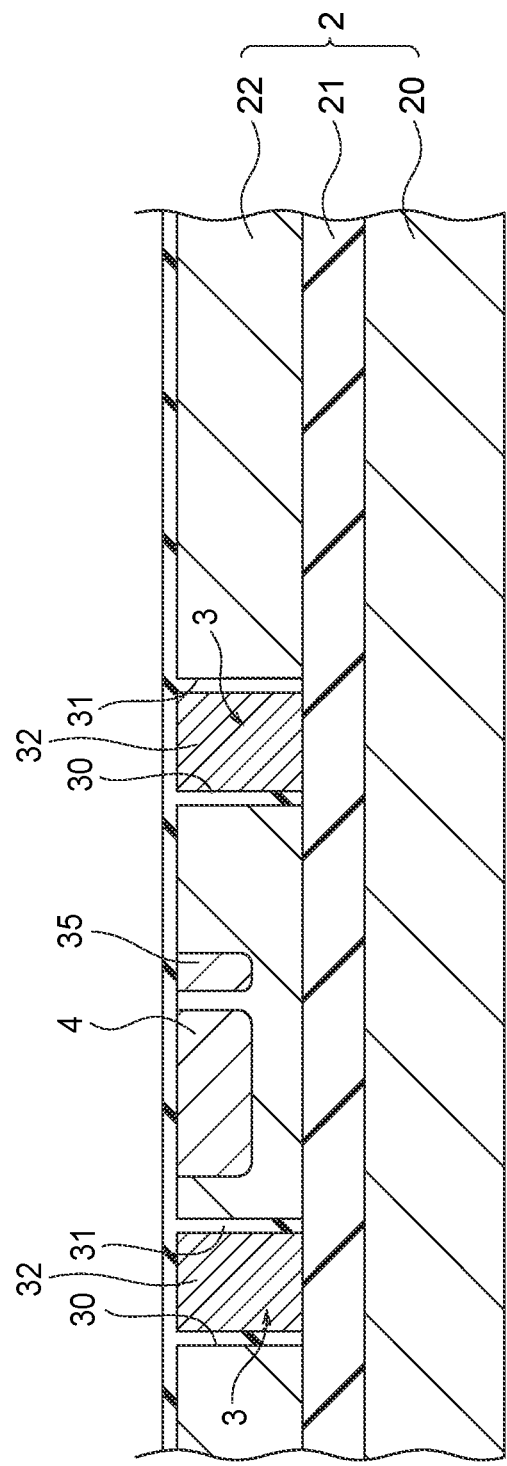

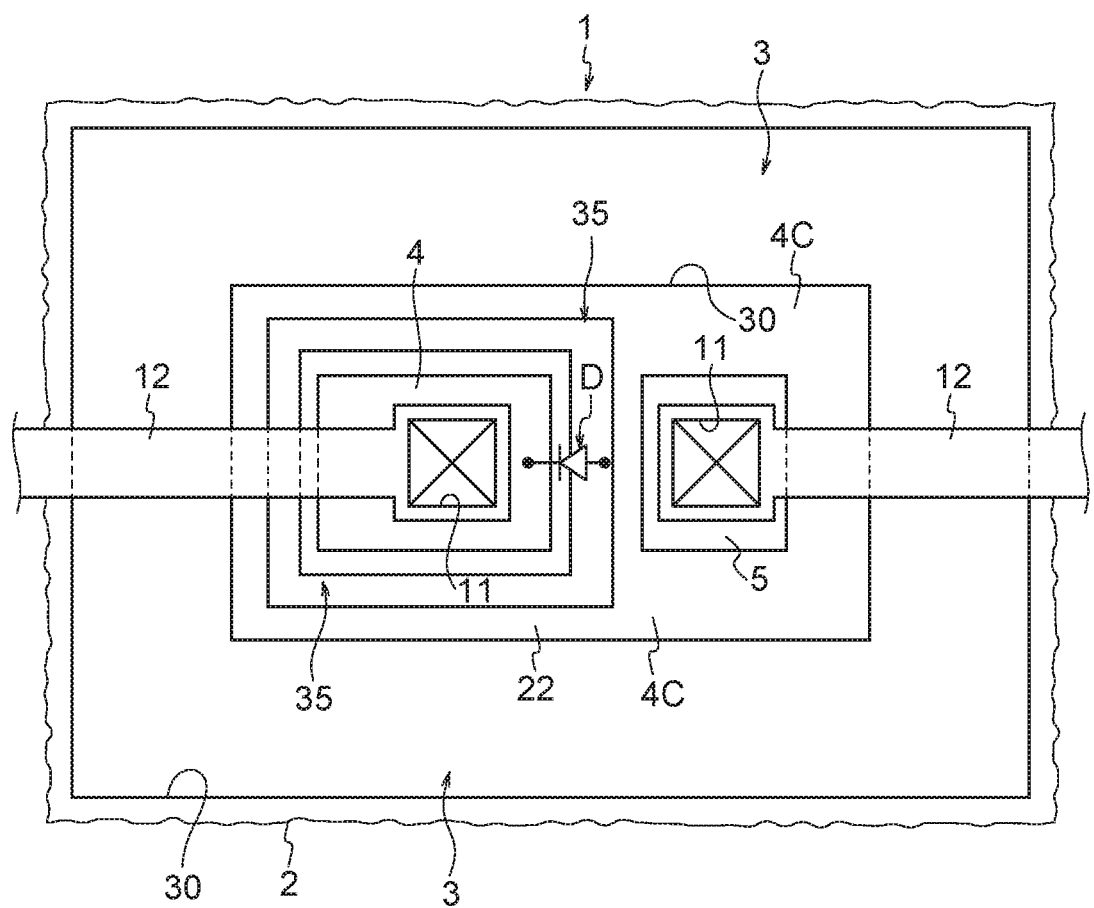

SEMICONDUCTOR DEVICE AND METHOD FOR MANUFACTURING SAME

CROSS-REFERENCE TO RELATED APPLICATIONS

This application is a national phase application of International Application No. PCT/JP2019/027017 filed on Jul. 8, 2019, which, in turn, is based upon and claims the right of priority to JP Patent Application No. 2018-135264 filed on Jul. 18, 2018, the disclosures of both of which are hereby incorporated by reference herein in their entirety for all purposes.

TECHNICAL FIELD

The present invention relates to a semiconductor device and a manufacturing method thereof, and in particular to effective technology applicable to a semiconductor device including a protected element and a manufacturing method thereof.

BACKGROUND ART

Japanese Patent No. 4354876 discloses a semiconductor device adopting a silicon on insulator (SOI) substrate. The SOI substrate is formed as a layered structure including a silicon substrate, a buried oxide film on the silicon substrate, and a p-type active layer on the buried oxide film. A metal-oxide-semiconductor field-effect transistor (MOSFET) is formed on the p-type active layer.

Generally a silicon substrate of a SOI substrate is either in a floating state not applied with an electrical potential, or a ground potential is applied to the silicon substrate.

However, when forming a p-n junction diode having a high withstand voltage structure on the p-type active layer of the SOI substrate as a protected element, an impurity concentration of the p-type active layer needs to be set lower, and the junction withstand voltage of the p-n junction raised. Supposing for example a negative surge voltage were applied to the anode region. Setting the impurity concentration of the anode region lower would enable a depletion layer to spread from the p-n junction toward the anode region, enabling the junction withstand voltage of the p-n junction diode to be increased.

However, changing the impurity concentration of the p-type active layer would cause an alteration to occur in the element characteristics of an element other than the p-n junction diode mounted on the same SOI substrate, and would specifically alter the threshold voltage ($V_{th}$) and the like of a MOSFET.

SUMMARY OF INVENTION

Technical Problem

In consideration of the above circumstances, the present invention provides a semiconductor device and a manufacturing method thereof that are capable of increasing a withstand voltage of a protected element without affecting characteristics of another element.

Solution to Problem

A semiconductor device according to a first aspect of the present invention includes a protected element, an element isolation region, a contact region, and a shield region. The protected element is configured including a p-n junction diode between an anode region and a cathode region, and is arranged in an active layer of a substrate including the active layer formed over a substrate-support with an insulation layer interposed between the active layer and the substrate-support. The element isolation region is arranged in the active layer so as to surround a periphery of the p-n junction diode and electrically isolates the p-n junction diode from an element arranged at the periphery of the p-n junction diode. The contact region is arranged at a portion on a main face of the anode region, is set with a same conductivity type as the anode region, and is set with a higher impurity concentration than the anode region. The shield region is arranged between the cathode region and the contact region so as to extend from the main face of the anode region as far as a region deeper than a depth of the contact region and shallower than the anode region, and is configured including a semiconductor region with an opposite conductivity type to the anode region.

The semiconductor device according to the first aspect includes the protected element and the element isolation region on the substrate. The substrate includes the substrate-support, the insulation layer on the substrate-support, and the active layer on the insulation layer. The protected element is configured including the p-n junction diode between the anode region and the cathode region, and is arranged in the active layer. The element isolation region is arranged in the active layer so as to surround the periphery of the p-n junction diode. The element isolation region electrically isolates the p-n junction diode from the element arranged at the periphery of the p-n junction diode.

Furthermore, the contact region is arranged at a portion on a main face of the anode region. The contact region is set with a same conductivity type as the anode region, and is set with a higher impurity concentration than the anode region.

The semiconductor device also includes the shield region. The shield region is arranged between the cathode region and the contact region so as to extend from the main face of the anode region as far as a region deeper than a depth of the contact region and shallower than the anode region. The shield region is configured including the semiconductor region with the opposite conductivity type to the anode region. Supposing a negative surge voltage were to be applied to the anode region, then a depletion layer is able to spread from the p-n junction between the cathode region and the anode region along the shield region and moreover detour around the shield region toward the anode region side. This enables the junction withstand voltage of the p-n junction diode to be increased.

Due to not setting a low impurity concentration for the active layer, the junction withstand voltage of the p-n junction diode can be increased without affecting the characteristics of elements other than the p-n junction diode.

A semiconductor device according to a second aspect of the present invention is the semiconductor device according to the first aspect, wherein the shield region is set with a same impurity concentration as an impurity concentration of the cathode region, and is set with a same p-n junction depth as a p-n junction depth of the cathode region to the anode region.

In the semiconductor device according to the second aspect, the shield region is set with the same impurity concentration as an impurity concentration of the cathode region, and is set with the same p-n junction depth as the p-n junction depth of the cathode region.

This enables the shield region to be simply configured with a similar structure to the cathode region, enabling the junction withstand voltage of a p-n junction diode to be increased in a simple manner.

A semiconductor device according to a third aspect of the present invention is the semiconductor device according to the first aspect or the second aspect, wherein the element isolation region includes a trench extending from a surface of the active layer at least as far as the insulation layer, an insulation body arranged at side walls of the trench, and a conductor arranged at side walls of the trench with the insulation body interposed between the side walls of the trench and the conductor. The shield region extends along between the cathode region and the contact region, and is arranged such that both extension direction ends of the shield region contact the element isolation region.

In the semiconductor device according to the third aspect, the element isolation region includes the trench, the insulation body, and the conductor. The trench extends from the surface of the active layer at least as far as the insulation layer, and the insulation body is arranged at the trench side walls. The conductor is arranged at the trench side walls with the insulation body interposed therebetween.

The shield region extends along between the cathode region and the contact region, and is arranged such that both extension direction ends contact the element isolation region.

This enables a depletion layer to spread from the p-n junction toward the anode region side also at locations where the shield region contacts the element isolation region, thereby enabling the junction withstand voltage of the p-n junction diode to be further increased.

A semiconductor device according to a fourth aspect of the present invention is the semiconductor device according to the first aspect or the second aspect, wherein the shield region is arranged so as to surround a periphery of the cathode region.

In the semiconductor device according to the fourth aspect, the shield region is arranged so as to surround the periphery of the cathode region and so a depletion layer is able to spread from the p-n junction between the cathode region and the anode region toward the anode region side and across an entire peripheral region of the cathode region. This enables the junction withstand voltage of the p-n junction diode to be still further increased.

A semiconductor device manufacturing method according to a fifth aspect of the present invention includes: a process of forming an element isolation region so as to surround a firming region for a p-n junction diode configuring a protected element in an active layer of a substrate including the active layer formed over a substrate-support with an insulation layer interposed between the active layer and the substrate-support, and of forming an anode region in the active layer such that a periphery of the anode region is surrounded by the element isolation region; a process of forming a cathode region having an opposite conductivity type to the anode region of the p-n junction diode on a portion on the main face of the anode region so as to form the p-n junction diode; a process of forming a contact region set with the same conductivity type as the anode region and set with a higher impurity concentration than the anode region on a different portion on the main face of the anode region to the portion formed with the cathode region; and a process of, in the same process as the process to form the cathode region, forming a shield region arranged between the cathode region and the contact region so as to extend from the main face of the anode region as far as a region deeper than a depth of the contact region and shallower than the anode region, and configured including a semiconductor region with an opposite conductivity type to the anode region.

In the semiconductor device manufacturing method according to the fifth aspect, first the element isolation region is formed on the substrate, and the anode region of the p-n junction diode configuring the protected element is formed. The substrate includes the substrate-support, the insulation layer on the substrate-support, and the active layer on the insulation layer. The element isolation region is formed in the active layer so as to surround the forming region for the p-n junction diode. The anode region is formed in the active layer such that a periphery of the anode region is surrounded by the element isolation region.

Next, the cathode region is formed on a portion of the main face of the anode region, so as to form the p-n junction diode including the anode region and the cathode region. The cathode region is set with the opposite conductivity type to the anode region.

The contact region is formed at a different portion of the main face of the anode region to the portion where the cathode region is formed. The contact region is set with the same conductivity type to the anode region, and the impurity concentration of the contact region is set higher than the impurity concentration of the anode region.

The shield region is formed in the same process as the process to form the cathode region. The shield region is arranged between the cathode region and the contact region so as to extend from the main face of the anode region as far as a region deeper than the depth of the contact region and shallower than the anode region. The shield region is configured including the semiconductor region with the opposite conductivity type to the anode region.

The shield region is formed utilizing the process to form the cathode region, and so the number of manufacturing processes can be reduced by the elimination of an extra process to firm the shield region. Moreover, the junction withstand voltage of the p-n junction diode can still be increased.

Advantageous Effects

The present invention enables the provision of a semiconductor device and a manufacturing method thereof that are capable of increasing the withstand voltage of a protected element without affecting characteristics of another element.

BRIEF DESCRIPTION OF DRAWINGS

FIG. 2 is a plan view schematically illustrating an enlargement of relevant portions of the semiconductor device illustrated in FIG. 1.

FIG. 3 is a first process cross-section to explain a manufacturing method of the semiconductor device illustrated in FIG. 1.

FIG. 4 is a second process cross-section to explain a manufacturing method of a semiconductor device.

FIG. 5 is a plan view corresponding to FIG. 2 and schematically illustrating an enlargement of relevant portions of a semiconductor device according to a second exemplary embodiment of the present invention.

DESCRIPTION OF EMBODIMENTS

First Exemplary Embodiment

Figure 1:
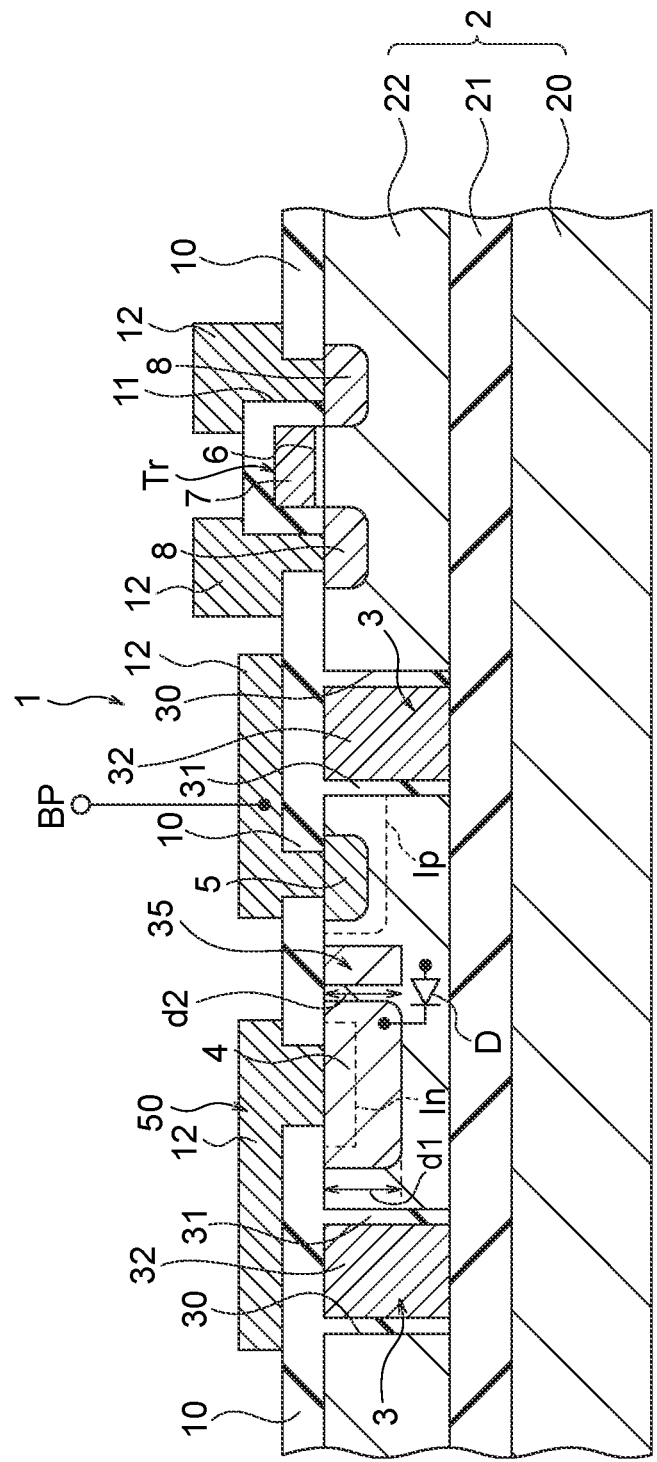
FIG. 1 is a vertical cross-section structural diagram (a cross-section sectioned along line A-A in FIG. 2) schematically illustrating an enlargement of relevant portions of a semiconductor device according to a first exemplary embodiment of the present invention.

Explanation follows regarding a semiconductor device and a manufacturing method thereof according to a first exemplary embodiment of the present invention, with reference to FIG. 1 to FIG. 4.

Semiconductor Device 1 Substrate Cross-Section Structure

As illustrated in FIG. 1 and FIG. 2, a semiconductor device 1 according to the present exemplary embodiment is principally configured by a substrate (a semiconductor pellet or a semiconductor chip) 2. A p-n junction diode D (hereafter simply referred to as the diode D), serving as a protected element, is arranged at a portion on a main face of the substrate 2. The diode D is electrically connected to an external terminal BP by connecting in the forward direction.

A SOI substrate is employed as the substrate 2. Namely, the substrate 2 has a structure of sequentially stacked layers of a conductive substrate-support 20, an insulation layer 21 formed on the substrate-support 20, and an active layer 22 formed on the insulation layer 21.

In this example, the substrate-support 20 is formed by a monocrystalline silicon substrate set as p-type with a low impurity concentration. Note that the substrate-support 20 may be set as p-type with a medium or high impurity concentration, or alternatively may be set as n-type.

The insulation layer 21 is formed by a buried oxide (BOX) film, and more specifically is formed by a silicon oxide film. The insulation layer 21 is for example formed using an ion implantation method in which oxygen is implanted into the substrate-support 20 so as to cause localized oxidation of silicon in the substrate-support 20.

In this example, the active layer 22 is, similarly to the substrate-support 20, formed by a monocrystalline silicon substrate set as p-type with a low impurity concentration. The active layer 22 is formed using part of a surface layer of the substrate-support 20, and forming the insulation layer 21 creates a partition (electrically isolates) between the active layer 22 and the substrate-support 20 about the insulation layer 21 as a boundary. The diode D is arranged in the active layer 22, and another circuit-configuring semiconductor element other than the diode D is also arranged in the active layer 22.

Although not particularly limited, examples of the semiconductor element include an insulated-gate field-effect transistor Tr (IGFET) (hereafter simply referred to as transistor Tr). Note that use of the term IGFET encompasses both MOSFET and metal-insulator-semiconductor field-effect transistors (MISFET).

Element Isolation Region 3 Structure

As illustrated in FIG. 1 and FIG. 2, an element isolation region 3 configuring a region surrounding the periphery of the diode D is arranged in the active layer 22. As illustrated in FIG. 1, the element isolation region 3 is also arranged in the active layer 22 so as to configure a region surrounding the periphery of the transistor Tr. The element isolation region 3 is configured so as to electrically isolate between elements, such as between the diode D and the semiconductor element other than the diode D that is arranged at the periphery of the diode D, i.e. the transistor Tr in this example.

In the present exemplary embodiment, the element isolation region 3 is configured including a trench 30, an insulation body 31, and a conductor 32, and is configured as what is referred to as a trench isolation structure.

The trench 30 surrounds the periphery of the diode D, and is configured so as to extend from the surface of the active layer 22 at least as far as the surface of the insulation layer 21. The trench 30 is set so as to have a smaller groove opening width dimension than its groove depth dimension (so as to have a large aspect ratio). Namely, adopting the element isolation region 3 including the trench 30 reduces the surface area occupied by the element isolation region 3 above the surface of the active layer 22, thereby enabling the integration density of the semiconductor device 1 to be improved. The trench 30 may be formed by anisotropic etching such as reactive-ion etching (RIE) during a manufacturing process of the semiconductor device 1.

Although the value is merely an example, a groove width of the trench 30 illustrated in FIG. 1 is set to 3 μm or the like. Moreover, a thickness of the active layer 22 (anode region thickness) of the substrate 2 is set to the same dimension as a depth of the trench 30, the depth of the trench 30 being set to 15 μm, for example.

The insulation body 31 is arranged at side walls of the trench 30. The insulation body 31 is for example formed by a silicon oxide film. The silicon oxide film may for example be formed using a chemical vapor deposition (CVD) method.

The conductor 32 is filled inside of the trench 30 with the insulation body 31 interposed between the conductor 32 and the trench 30. For example, a polycrystalline silicon film may be employed as the conductor 32. The polyctystalline silicon film may be doped with impurities when need arises, such as when applied with a ground potential, so as to adjust the polycrystalline silicon film to a low resistance value. In the manufacturing process of the semiconductor device 1, a polycrystalline silicon film may for example be filled into the trench 30 by deposition using a CVD method until the polycrystalline silicon film configures a flat surface over the active layer 22. The polycrystalline silicon film over the active layer 22 is then removed, leaving the inside of the trench 30 completely filled. The removal of the polycrystalline silicon may be performed by employing an etching method or a chemical mechanical polishing (CMP) method.

Diode D Structure

As illustrated in FIG. 1 and FIG. 2, the diode D is configured by a p-n junction between the p-type active layer 22 serving as an anode region and an n-type semiconductor region 4 serving as a cathode region.

A bottom face of the active layer 22 serving as the anode region is surrounded by the insulation layer 21 (see FIG. 1), and side faces around the entire periphery of the active layer 22 are surrounded by the element isolation region 3 (see FIG. 1 and FIG. 2). There is no particular limitation to the planar profile of the active layer 22. As illustrated in FIG. 2, in this example, the active layer 22 is formed with a long and thin rectangular planar profile running along a left-right direction. More specifically, the n-type semiconductor region 4 serving as the cathode region and a contact region (p-type semiconductor region 5), described later, are arranged in the active layer 22 along the left-right direction. The active layer 22 is accordingly formed in a rectangular shape with its length direction along the left-right direction.

Note that as illustrated in FIG. 1, since the active layer 22 is employed as the anode region, a depth from the surface of the anode region is equivalent to a depth from the surface of the active layer 22.

The n-type semiconductor region 4 is formed by introducing n-type impurities into the active layer 22 from the surface thereof using an ion implantation method or a solid phase diffusion method, and activating the n-type impurities. The impurity concentration of the n-type semiconductor region 4 is set with a higher impurity concentration than the impurity concentration of the active layer 22. A p-n junction depth d1 of the n-type semiconductor region 4 to the active layer 22 is set shallower than the depth of the active layer 22. In addition thereto, the p-n junction depth d1 is configured deeper than the depth of the contact region (p-type semiconductor region 5), described later.

The p-type semiconductor region 5 employed as the contact region with the same conductivity type as the active layer 22 is arranged on a portion on the main face of the active layer 22 serving as the anode region. The p-type semiconductor region 5 is set with a higher impurity concentration than the impurity concentration of the n-type semiconductor region 4. A depth of the p-type semiconductor region 5 from the surface of the active layer 22 is set shallower than the p-n junction depth d1 of the n-type semiconductor region 4. In other words, the p-n junction depth di of the n-type semiconductor region 4 is arranged at a region deeper than the depth of the p-type semiconductor region 5, and shallower than the depth of the anode region.

Thus arranging the p-type semiconductor region 5 enables a reduction to be achieved in contact resistance (connection resistance) between the active layer 22, serving as the anode region, and wiring that is electrically connected thereto (wiring 12 illustrated in FIG. 1 and FIG. 2).

As illustrated in FIG. 1, a passivation film 10 is arranged over the entire surface of the substrate 2, including over the diode D and over the element isolation region 3. The passivation film 10 is for example formed of a monolayer configured by a silicon oxide film or a silicon nitride film, or a composite film formed by stacking these films together.

As illustrated in FIG. 1 and FIG. 2, the wiring 12 is arranged on the passivation film 10. Although the wiring 12 is illustrated as a monolayer wiring structure, a wiring structure of two or more layers may be employed. For example, an aluminum alloy film to which copper (Cu) and silicon (Si) has been added may be employed as the wiring 12.

One end portion of one line of the wiring 12 illustrated on the left side in FIG. 1 and FIG. 2 is electrically connected to the n-type semiconductor region 4 serving as the cathode region through a connection hole 11 formed penetrating the passivation film 10 in its film thickness direction. The other end portion of this wiring 12 extends over the active layer 22 with the passivation film 10 interposed therebetween, runs across the element isolation region 3, and is connected to internal circuitry, not illustrated in the drawings.

One end portion of another line of the wiring 12 illustrated on the right side therein is electrically connected to the p-type semiconductor region 5 through a connection hole 11, and the p-type semiconductor region 5 is electrically connected to the p-type active layer 22 serving as the anode region. The other end portion of this wiring 12 extends over the active layer 22 with the passivation film 10 interposed therebetween, runs across the element isolation region 3, and is connected to the external terminal BP, not illustrated in the drawings.

Transistor Tr Structure

As illustrated in FIG. 1, the transistor Tr is arranged at a portion on the main face of the active layer 22 in a region peripherally surrounded by the element isolation region 3. The transistor Tr is configured including the active layer 22 employed as a channel forming region, n-type semiconductor regions 8 that form a pair of main electrodes that respectively serve as a source region and a drain region, a gate insulation film 6, and a gate electrode 7.

The pair of n-type semiconductor regions 8 are arranged on the main face portion of the active layer 22 with a spacing in a gate width direction therebetween. Although the n-type semiconductor regions 8 have the opposite conductivity type to the p-type semiconductor region 5, the n-type semiconductor regions 8 are set with a similar level of impurity concentration to the p-type semiconductor region 5. A region of the active layer 22 between the pair of n-type semiconductor regions 8 is employed as a channel forming region.

The gate insulation film 6 is at least formed between the pair of n-type semiconductor regions 8 on the main face of the active layer 22. A monolayer film configured of a silicon oxide film, or a stacked composite film including a silicon oxide film and a silicon nitride film, may be employed as the gate insulation film 6.

The gate electrode 7 is arranged on the gate insulation film 6. For example, a monolayer film configured from a polycrystalline silicon film doped with impurities so as to be adjusted to a low resistance value, or a stacked composite film including a high-melting-point metal film or a high-melting-point metal-silicide film on a polycrystalline silicon film, may be employed as the gate electrode 7.

The transistor Tr configured in this manner is thereby set to n-channel conductivity type. Note that in the present exemplary embodiment a non-illustrated p-channel conductivity type transistor is also arranged in the active layer 22 so as to construct a pair of complementary transistors. The active layer in which the p-channel conductivity type transistor is arranged is set to n-type.

Shield Region 35 Structure

As illustrated in FIG. 1 and FIG. 2, in the semiconductor device 1 configured as described above, a shield region 35 is arranged on a portion on the main face of the p-type active layer 22 serving as the anode region. The shield region 35 is configured including an n-type semiconductor region with the opposite conductivity type to the anode region (p-type semiconductor region 5), namely with the same conductivity type as the cathode region (n-type semiconductor region 4).

More specifically, the shield region 35 is arranged extending in a depth direction from the main face of the anode region between the cathode region and the contact region. Note that as illustrated in FIG. 1, a p-n junction depth d2 of the shield region 35 from the surface of the active layer 22 is deeper than a depth of the contact region, and also shallower than a depth of the anode region as well as a depth of the element isolation region. In the present exemplary embodiment, the p-n junction depth d2 of the shield region 35 is set as the same junction depth as the p-n junction depth d1 of the n-type semiconductor region 4 serving as the cathode region.

Supposing for example a negative surge voltage were to be applied to the anode region. Since the depth d2 of the shield region 35 is set deeper than the depth of the contact region, spread can be prevented of a depletion layer Ip in a lateral direction (a direction parallel to the main face of the active layer 22) toward the contact region side from the p-n junction between the cathode region and the anode region. However, since the depth d2 of the shield region 35 is set shallower than the depth of the anode region, a region where the spread of the depletion layer Ip is promoted can be formed in a region below the shield region 35. Namely, the depletion layer Ip can spread from the p-n junction toward the anode region side by spreading along the shield region 35 and detouring around the shield region 35.

The shield region 35 has its extension direction along an up-down direction, as illustrated in FIG. 2, and has its width direction in a direction intersecting the extension direction, namely in a direction orthogonal to the extension direction in this example. Although not allocated specific reference numerals, as illustrated in FIG. 1 and FIG. 2, the width of the shield region 35 is set narrower than a groove width of the trench 30 of the element isolation region 3. The width of the shield region 35 is set to 1 μm, for example.

As illustrated in FIG. 2, the shield region 35 extends along between the cathode region and the contact region, and is arranged such that both extension direction ends (an upper end and a lower end) of the shield region 35 contact the element isolation region 3.

Semiconductor Device 1 Manufacturing Method

A description follows regarding a manufacturing method of the semiconductor device 1 according to the present exemplary embodiment, and in particular regarding a manufacturing method of the shield region 35.

First, the substrate 2 is prepared (see FIG. 3). An SOI substrate is employed as the substrate 2, and the substrate 2 includes the active layer 22 on the substrate-support 20, with the insulation layer 21 interposed therebetween. The active layer 22 is set to p-type, and is set with a low impurity concentration.

As illustrated in FIG. 3, the element isolation region 3 is formed in the active layer 22 so as to surround both the periphery of a forming region DR for the diode D and the periphery of a forming region TR for the transistor Tr.

First, the trench 30 of the element isolation region 3 is formed. The trench 30 is formed by forming a mask using non-illustrated photolithography, and then performing etching on the active layer 22 using the mask. This etching may be anisotropic etching such as RIE as previously described.

The insulation body 31 is then formed to at least the side walls of the trench 30. The conductor 32 is then filled inside the trench 30, and the element isolation region 3 is accordingly formed thereby.

When the element isolation region 3 has been formed, the periphery of the active layer 22 is surrounded by the element isolation region 3 at the forming region DR for the diode D, such that the peripherally surrounded active layer 22 forms the anode region. Namely, a process to form the element isolation region 3 is incorporated in the manufacturing method of the semiconductor device 1 according to the present exemplary embodiment, after a process to form the active layer 22 serving as the anode region.

Alternatively, if an anode region were to be formed at the forming region DR alone, such an anode region would be formed in the same process as the process to form the element isolation region 3 in this manufacturing method.

Note that the anode region may be formed after the process to form the element isolation region 3 by first forming the active layer 22 and the element isolation region 3, and then implanting p-type impurities into the active layer 22 set with an appropriate impurity concentration.

As illustrated in FIG. 1 previously described, the forming region TR for the transistor Tr is formed when the element isolation region 3 is formed.

Next, as illustrated in FIG. 4, in the forming region DR, n-type impurities are introduced into a portion on the main face of the active layer 22 so as to form the n-type semiconductor region 4 serving as the cathode region. The n-type semiconductor region 4 is formed by introducing n-type impurities using an ion implantation method or a solid phase diffusion method employing a mask formed by photolithography, omitted from illustration, and activating the n-type impurities. When the n-type semiconductor region 4 has been formed, the diode D is effectively complete.

Note that, as is also illustrated in FIGS. 4, the shield region 35 configured including the n-type semiconductor region is formed between the cathode region and the contact region in the forming region DR in the same process as the process to form the cathode region (n-type semiconductor region 4). The shield region 35 is formed by employing the same mask as the mask employed to form the cathode region, and by introducing n-type impurities in the same process as the process to introduce n-type impurities to form the cathode region.

Next, the gate insulation film 6 and the gate electrode 7 are respectively formed in sequence on the main face of the active layer 22 in the forming region TR (see FIGS. 1). The n-type semiconductor regions 8 employed as the pair of main electrodes are then formed on a portion on the main face of the active layer 22 (see FIG. 1). Similarly to in the forming process of the n-type semiconductor region 4, the n-type semiconductor regions 8 are formed by introducing n-type impurities using an ion implantation method employing a non-illustrated mask, and activating the n-type impurities. When the n-type semiconductor regions 8 have been formed, the transistor Tr is effectively complete.

Next, the p-type semiconductor region 5 serving as the contact region is formed in the forming region DR on a portion on the main face of the active layer 22 (of the anode region) (see FIG. 1). Similarly to the process in which the n-type semiconductor region 4 is formed, the p-type semiconductor region 5 is formed by introducing p-type impurities employing a non-illustrated mask, and activating the p-type impurities.

Next, the passivation film 10 is formed over the active layer 22, and over the element isolation region 3, including over the diode D and over the transistor Tr. The connection holes 11 are then formed in the passivation film 10 above the n-type semiconductor region 4, above the p-type semiconductor region 5, and above the n-type semiconductor regions 8 (see FIG. 1).

Next, plural lines of the wiring 12 to be respectively connected to the n-type semiconductor region 4, the p-type semiconductor region 5, and the n-type semiconductor regions 8 through the connection holes 11 are formed on the passivation film 10.

Although illustration and explanation is omitted, upper layer wiring, a final passivation film, and so on are then formed.

When this series of manufacturing processes has ended, the semiconductor device 1 according to the present exemplary embodiment, provided with a protected element configured including the diode D, is then complete.

Operation and Advantageous Effects of Present Exemplary Embodiment

As illustrated in FIG. 1 and FIG. 2, the semiconductor device 1 according to the present exemplary embodiment includes the protected element and the element isolation region 3 provided to the substrate 2. The substrate 2 includes the substrate-support 20, the insulation layer 21 on the substrate-support 20, and the active layer 22 on the insulation layer 21. The protected element is arranged in the active layer 22 and is configured including the diode D between the anode region (p-type active layer 22) and the cathode region (n-type semiconductor region 4). The element isolation region 3 is arranged in the active layer 22 so as to surround the periphery of the diode D. The element isolation region 3 electrically isolates the diode D from an element arranged at the periphery of the diode D.

The contact region (p-type semiconductor region 5) is also arranged at a portion on the main face of the anode region. The contact region is set with the same conductivity type as the anode region, and is set with a higher impurity concentration than the anode region.

Note that the semiconductor device 1 further includes the shield region 35. The shield region 35 is arranged between the cathode region and the contact region with a p-n junction depth d2 extending as far as a region that is deeper than the depth of the contact region from the main face of the anode region, and shallower than the anode region. The shield region 35 is configured including the semiconductor region with the opposite conductivity type to the anode region.

Supposing for example a negative surge voltage were applied to the anode region. As illustrated in FIG. 1, first, when a surge voltage is applied, a depletion layer. In spreads toward the cathode region side from the p-n junction between the cathode region (n-type semiconductor region 4) and the anode region (p-type active layer 22). A depletion layer Ip also spreads toward the anode region side from the p-n junction.

Note that for example a ground potential (0V) is respectively applied to the substrate-support 20 of the substrate 2 and the conductor 32 of the element isolation region 3. As a result, the substrate-support 20, the insulation layer 21, and the active layer 22 of the substrate 2 configure a field plate structure, and furthermore the conductor 32 and the insulation body 31 of the element isolation region 3 together with the active layer 22 similarly configure a field plate structure. This enables the spreading of the depletion layer Ip to be increased.

Moreover, since the shield region 35 is provided, the depletion layer Ip can spread toward the anode region side by spreading from the p-n junction between the cathode region and the anode region along the shield region 35, and moreover detouring around the shield. region 35. This enables the junction withstand voltage of the diode D to be increased.

There is accordingly no need to set the active layer 22 with a lower impurity concentration, and so the junction withstand voltage of the diode D can be increased without affecting the characteristics of the element other than the diode D, namely the transistor Tr illustrated in FIG. 1. Examples thereof include modifying characteristic such as the threshold voltage of the transistor Tr, the parasitic capacitance of the transistor Tr, and the like.

As illustrated in FIG. 1, in the semiconductor device 1 according to the present exemplary embodiment, the shield region 35 is set with the same impurity concentration as the impurity concentration of the cathode region, and is set with the same p-n junction depth d2 as the p-n junction depth di of the cathode region.

This enables the shield region 35 to be simply configured with a similar structure to the cathode region, enabling the junction withstand voltage of the diode D to be increased in a simple manner.

Moreover, as illustrated in FIG. 1 and FIG. 2, in the semiconductor device 1 according to the present exemplary embodiment, the element isolation region 3 includes the trench 30, the insulation body 31, and the conductor 32. The trench 30 extends from the surface of the active layer 22 at least as far as the insulation layer 21, and the insulation body 31 is arranged at the side walls of the trench 30. The conductor 32 is arranged at the side walls of the trench 30 with the insulation body 31 interposed therebetween.

The shield region 35 extends along between the cathode region (n-type semiconductor region 4) and the contact region (p-type semiconductor region 5), and is arranged such that both extension direction ends of the shield region 35 contact the element isolation region 3.

This enables the depletion layer Ip to also spread from the p-n junction toward the anode region side at locations where the shield region 35 contacts the element isolation region 3, thereby enabling the junction withstand voltage of the diode D to be further increased.

In the manufacturing method of the semiconductor device 1 according to the present exemplary embodiment, first the element isolation region 3 is formed on the substrate 2, and the anode region (p-type active layer 22) of the diode D configuring the protected element is formed (see FIG. 1 and FIG. 3). The substrate 2 includes the substrate-support 20, the insulation layer 21 on the substrate-support 20, and the active layer 22 on the insulation layer 21. The element isolation region 3 is formed in the active layer 22 so as to surround the periphery of the forming region DR for the diode D. The anode region is formed in the active layer 22 such that a periphery of the anode region is surrounded by the element isolation region 3.

Next, the cathode region (n-type semiconductor region 4) is formed at the main face portion of the anode region, and the diode D including the anode region and the cathode region is formed. The cathode region is set with the opposite conductivity type to the anode region.

The contact region (p-type semiconductor region 5) is formed at a different portion on the main face of the anode region to the portion formed with the cathode region. The contact region is set with the same conductivity type as the anode region, and the impurity concentration of the contact region is set at a higher impurity concentration than the anode region.

The shield region 35 is formed in the same process as the process to form the cathode region. More specifically, as illustrated in FIG. 4, the n-type semiconductor region of the shield region 35 is formed in the same process as the process to form the n-type semiconductor region 4 configuring the cathode region. The shield region 35 is arranged between the cathode region and the contact region so as to extend by the p-n junction depth d2 from the main face of the anode region as far as a region deeper than the depth of the contact region and shallower than the anode region.

The shield region 35 can be formed utilizing the process to form the cathode region, and so the number of manufacturing processes can be reduced by the elimination of an extra. process to form the shield region 35. Moreover, the junction withstand voltage of the diode D can still be increased.

Thus, the semiconductor device 1 and manufacturing method thereof according to the present exemplary embodiment enable the withstand voltage of the protected element to be improved without affecting other elements.

Second Exemplary Embodiment

Explanation follows regarding a semiconductor device 1 and manufacturing method thereof according to a second exemplary embodiment of the present invention, with reference to FIG. 5. Note that in the present exemplary embodiment, configuration elements that are the same or configuration elements that are effectively the same as configuration elements in the semiconductor device 1 and manufacturing method thereof according to the first exemplary embodiment are allocated the same reference numerals, and explanation thereof is omitted.

In the semiconductor device 1 according to the present exemplary embodiment, an arrangement layout of the shield region 35 is different to that of the semiconductor device 1 according to the first exemplary embodiment, Namely, as illustrated in FIG. 5, the shield region 35 is arranged between the cathode region (n-type semiconductor region 4) and the contact region (p-type semiconductor region 5), and is also arranged so as to surround the entire periphery of the cathode region.

Although there is no particular limitation to the planar profile of the shield region 35, in this plan view, the cathode region is formed in a rectangular shape, and the shield region 35 is formed in a rectangular frame shape that is endless in its extension direction.

Although drawings and description are omitted, in the manufacturing method of the semiconductor device 1 according to the present exemplary embodiment, the shield region 35 may be formed in the same process as the process to form the cathode region, similarly to in the manufacturing method of the semiconductor device 1 according to the first exemplary embodiment.

The semiconductor device 1 configured in this manner enables similar operation and advantageous effects to be obtained as the operation and advantageous effects obtained in the semiconductor device 1 according to the first exemplary embodiment previously described.

Moreover, in the semiconductor device 1 according to the present exemplary embodiment, the shield region 35 is arranged so as to surround the periphery of the cathode region, and so the depletion layer Ip (see FIG. 1) is able to spread from the p-n junction between the cathode region and the anode region toward the anode region side over the entire peripheral region of the cathode region. This enables the junction withstand voltage of the diode D to be still further increased.

Furthermore, in the manufacturing method of the semiconductor device 1, the shield region 35 can be formed utilizing the process for forming the cathode region, enabling the number of manufacturing processes to be reduced.

Supplementary Explanation of Above Exemplary Embodiments

The present invention is not limited to the above exemplary embodiments, and for example modifications such as those described below may be implemented within a range not departing from the spirit of the present invention.

For example, in the above exemplary embodiments, an example has been given in which a single shield region is arranged at the diode. However, in the present invention, plural shield regions may be arranged between the cathode region of the diode and the contact region so as to be parallel to a width direction.

Moreover, in the above exemplary embodiments, the shield region is principally formed by the n-type semiconductor region. However, a shallow trench may be formed, and an n-type semiconductor region may be formed along a bottom face and side walls of this trench. In such cases, the shield region is configured including the shallow trench and the n-type semiconductor region. Furthermore, an insulation body may be filled inside the shallow trench. In such cases, the shield region is configured including the shallow trench, the n-type semiconductor region, and the insulation body.

Moreover, a silicon oxide film (field insulation film) may be formed by selectively oxidizing a main face of the n-type semiconductor region, and a shield region may be configured including the n-type semiconductor region and this silicon oxide film.

The present invention may include a bipolar transistor, a resistor element, or a capacitor element as the semiconductor device other than the diode.

Moreover, for the substrate of the semiconductor device of the present invention, the substrate-support is not limited to being a monocrystalline silicon substrate and, for example, a metal substrate or a compound semiconductor substrate may be employed therefor.

Furthermore, in the present invention any element including a p-n junction diode may be employed as the protected element, such as an IGFET, a bipolar transistor, or a diffusion resistor. Specifically, a diode is formed at the p-n junction between one main electrode of an IGFET and the active layer. In cases in which a bipolar transistor is employed, a diode is formed at the p-n junction between a base region (active layer) and an emitter region or a collector region. In cases in which a diffusion resistor is employed, a diode is firmed at the p-n junction between the diffusion resistor and the active layer.

Moreover, in the present invention, a protected element may be constructed by two or more elements, such as a combination of a diode and an IGFET, or a combination of a diffusion resistor and an IGFET.

The entire content of the disclosure of Japanese Patent Application No. 2018-135264 filed on Jul. 18, 2018 is incorporated by reference in the present specification.

The invention claimed is:

1. A semiconductor device comprising:
    a protected element that is configured to include a p-n junction diode between an anode region and a cathode region, and arranged in an active layer of a substrate including the active layer formed over a substrate-support with an insulation layer interposed between the active layer and the substrate-support;
    an element isolation region that is arranged in the active layer so as to surround a periphery of the p-n junction diode and to electrically isolate the p-n junction diode from an element arranged at the periphery of the p-n junction diode;
    a contact region that is arranged at a portion on a main face of the anode region, set with a same conductivity type as the anode region, and set with a higher impurity concentration than the anode region; and
    a shield region that is arranged between the cathode region and the contact region so as to extend from the main face of the anode region as far as a region deeper than a depth of the contact region and shallower than the anode region, and configured to include a semiconductor region with an opposite conductivity type to the anode region,
    wherein the shield region is set with a same impurity concentration as an impurity concentration of the cathode region, and is set with a same p-n junction depth as a p-n junction depth of the cathode region to the anode region.

2. A semiconductor device comprising:
    a protected element that is configured to include a p-n junction diode between an anode region and a cathode region, and arranged in an active layer of a substrate including the active layer formed over a substrate-support with an insulation layer interposed between the active layer and the substrate-support;
    an element isolation region that is arranged in the active layer so as to surround a periphery of the p-n junction diode and to electrically isolate the p-n junction diode from an element arranged at the periphery of the p-n junction diode;

a contact region that is arranged at a portion on a main face of the anode region, set with a same conductivity type as the anode region, and set with a higher impurity concentration than the anode region; and a shield region that is arranged between the cathode region and the contact region so as to extend from the main face of the anode region as far as a region deeper than a depth of the contact region and shallower than the anode region, and configured to include a semiconductor region with an opposite conductivity type to the anode region, wherein the element isolation region includes:
- a trench extending from a surface of the active layer at least as far as the insulation layer,
- an insulation body arranged at side walls of the trench, and
- a conductor arranged at side walls of the trench with the insulation body interposed between the side walls of the trench and the conductor; and wherein the shield region extends along between the cathode region and the contact region, and is arranged such that both extension direction ends of the shield region contact the element isolation region.

\* \* \* \* \*